United States Patent
No et al.

(10) Patent No.: US 9,029,900 B2
(45) Date of Patent: *May 12, 2015

(54) ORGANIC LIGHT-EMITTING DISPLAY DEVICE AND METHOD OF MANUFACTURING THE SAME

(71) Applicant: Samsung Display Co., Ltd., Yongin-si, Gyeonggi-do (KR)

(72) Inventors: Dae-Hyun No, Yongin-si (KR); Jong-Hyun Choi, Yongin-si (KR); Gun-Shik Kim, Yongin-si (KR); June-Woo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 194 days.

This patent is subject to a terminal disclaimer.

(21) Appl. No.: 13/671,505

(22) Filed: Nov. 7, 2012

(65) Prior Publication Data

US 2013/0065338 A1   Mar. 14, 2013

Related U.S. Application Data

(62) Division of application No. 13/069,346, filed on Mar. 22, 2011, now Pat. No. 8,354,669.

(30) Foreign Application Priority Data

May 17, 2010   (KR) .................. 10-2010-0046030

(51) Int. Cl.
*H01L 27/28* (2006.01)
*H01L 27/32* (2006.01)
(Continued)

(52) U.S. Cl.
CPC ......... *H01L 27/3248* (2013.01); *H01L 27/3246* (2013.01); *H01L 51/5215* (2013.01);
(Continued)

(58) Field of Classification Search
CPC ............ H01L 29/786; H01L 29/78603; H01L 27/1214; H01L 27/1288; H01L 27/3241; H01L 27/3244; H01L 27/3246; H01L 27/3248
USPC ...................... 438/99, 22, 23, 29; 257/40, 88, 257/E33.001, E33.062, E33.064
See application file for complete search history.

(56) References Cited

U.S. PATENT DOCUMENTS 5,663,575 A   9/1997   Yamamura et al.
5,986,729 A   11/1999  Yamanaka et al.
(Continued)

FOREIGN PATENT DOCUMENTS

EP          2 214 211 A2    8/2010
KR   10-2002-0071059 A      9/2002
(Continued)

OTHER PUBLICATIONS

GPTO Office action dated Dec. 18, 2012, for corresponding German application 102011005528.2, (10 pages).
(Continued)

*Primary Examiner* — Michele Fan
(74) *Attorney, Agent, or Firm* — Christie, Parker & Hale, LLP

(57) ABSTRACT

An organic light-emitting display device and a method of its manufacture are provided, whereby manufacturing processes are simplified and display quality may be enhanced. The display device includes: an active layer of a thin film transistor (TFT), on a substrate and including a semiconducting material; a lower electrode of a capacitor, on the substrate, doped with ion impurities, and including a semiconducting material; a first insulating layer on the substrate to cover the active layer and the lower electrode; a gate electrode of the TFT, on the first insulating layer; a pixel electrode on the first insulating layer; an upper electrode of the capacitor, on the first insulating layer; source and drain electrodes of the TFT, electrically connected to the active layer; an organic layer on the pixel electrode and including an organic emission layer; and a counter electrode facing the pixel electrode, the organic layer between the counter electrode and the pixel electrode.

9 Claims, 8 Drawing Sheets

(51) Int. Cl.
  *H01L 51/52* (2006.01)
  *H01L 51/56* (2006.01)
  *H01L 27/12* (2006.01)

(52) U.S. Cl.
  CPC ............. *H01L51/5265* (2013.01); *H01L 51/56* (2013.01); *H01L 2227/323* (2013.01); *H01L 27/1248* (2013.01); *H01L 27/1255* (2013.01)

(56) References Cited

U.S. PATENT DOCUMENTS

| | | | |
|---|---|---|---|
| 6,335,211 | B1 | 1/2002 | Lee |
| 7,245,341 | B2 | 7/2007 | Yokoyama |
| 2001/0019373 | A1* | 9/2001 | Kobayashi et al. ............. 349/39 |
| 2001/0020991 | A1 | 9/2001 | Kubo et al. |
| 2003/0007108 | A1 | 1/2003 | Hwang et al. |
| 2004/0195573 | A1 | 10/2004 | Kim |
| 2005/0030463 | A1 | 2/2005 | Kaneko et al. |
| 2005/0162598 | A1 | 7/2005 | Choi et al. |
| 2005/0212988 | A1 | 9/2005 | Nagano et al. |
| 2006/0141643 | A1 | 6/2006 | Shih |
| 2006/0192481 | A1 | 8/2006 | Nagayama et al. |
| 2006/0262054 | A1 | 11/2006 | Yamazaki et al. |
| 2006/0269786 | A1 | 11/2006 | Shin et al. |
| 2006/0283833 | A1 | 12/2006 | Lee et al. |
| 2007/0002198 | A1 | 1/2007 | Yang et al. |
| 2007/0020910 | A1* | 1/2007 | Park et al. .................... 438/612 |
| 2007/0065991 | A1 | 3/2007 | Kim et al. |
| 2007/0273800 | A1 | 11/2007 | Nomura et al. |
| 2007/0284586 | A1 | 12/2007 | Park et al. |
| 2008/0002124 | A1 | 1/2008 | Yang |
| 2008/0012008 | A1 | 1/2008 | Song et al. |
| 2008/0105890 | A1 | 5/2008 | Kwak et al. |
| 2009/0163022 | A1 | 6/2009 | Lee et al. |
| 2010/0193790 | A1 | 8/2010 | Yeo et al. |
| 2012/0001182 | A1* | 1/2012 | Choi et al. ...................... 257/59 |

FOREIGN PATENT DOCUMENTS

| | | |
|---|---|---|
| KR | 10-2004-0103339 | 12/2004 |
| KR | 10-2006-0000356 | 1/2006 |
| KR | 10-2006-0094867 A | 8/2006 |
| KR | 10-2007-0091916 A | 9/2007 |
| KR | 10-2009-0076263 A | 7/2009 |
| KR | 10-2009-0120698 A | 11/2009 |

OTHER PUBLICATIONS

U.S. Office action dated Dec. 3, 2012, for cross reference U.S. Appl. No. 13/041,181, (12 pages).
U.S. Office action dated Jun. 25, 2014, for cross reference U.S. Appl. No. 13/041,181, (13 pages).
U.S. Office action dated Oct. 6, 2014, for cross reference U.S. Appl. No. 13/041,181, (11 pages).

* cited by examiner

ORGANIC LIGHT-EMITTING DISPLAY DEVICE AND METHOD OF MANUFACTURING THE SAME

CROSS-REFERENCE TO RELATED APPLICATION

This application is a divisional of U.S. patent application Ser. No. 13/069,346, filed Mar. 22, 2011, which claims priority to and the benefit of Korean Patent Application No. 10-2010-0046030, filed on May 17, 2010, the entire content of both of which is incorporated herein by reference.

BACKGROUND

1. Field

Aspects of embodiments according to the present invention relate to an organic light-emitting display device and a method of manufacturing the same.

2. Description of Related Art

Organic light-emitting display devices are expected to be the next generation of display devices due to their light weight, narrow profile, wide viewing angle, short response time, and low power consumption. An organic light-emitting display device that implements full-color images may employ an optical resonance structure that has different optical lengths at pixels with different colors (for example, red, green, and blue pixels).

SUMMARY

One or more embodiments of the present invention provide an organic light-emitting display device that is manufactured in a simple process and has excellent display quality, and a method of manufacturing the same.

In an exemplary embodiment according to the present invention, an organic light-emitting display device is disclosed. The organic light-emitting display device includes a substrate, an active layer of a thin film transistor, a lower electrode of a capacitor, a first insulating layer, a gate electrode of the thin film transistor, a pixel electrode, an upper electrode of the capacitor, source and drain electrodes of the thin film transistor, an organic layer, and a counter electrode. The active layer is on the substrate and includes a semiconducting material. The lower electrode is on the substrate, doped with ion impurities, and includes a semiconducting material. The first insulating layer is on the substrate and covers the active layer and the lower electrode. The gate electrode is on the first insulating layer and includes first, second, and third gate electrodes that are sequentially stacked. The first gate electrode includes a metal. The second gate electrode includes a transparent conductive material. The third gate electrode includes a metal. The pixel electrode is on the first insulating layer and includes first and second pixel electrodes that are sequentially stacked. The first pixel electrode includes a metal. The second pixel electrode includes a transparent conductive material. The upper electrode is on the first insulating layer and includes first and second upper electrodes. The first upper electrode includes a metal. The second upper electrode includes a transparent conductive material. The source and drain electrodes are electrically connected to the active layer. The organic layer is on the pixel electrode and includes an organic emission layer. The counter electrode faces the pixel electrode. The organic layer is intervening between the counter electrode and the pixel electrode.

The first gate electrode, the first pixel electrode, and the first upper electrode may each include a first metal. The first metal may be an aluminum alloy.

The aluminum alloy may further include nickel.

The first metal may have a thickness in a range of 50 to 200 Å.

The second gate electrode, the second pixel electrode, and the second upper electrode may each include a same transparent conductive material. The same transparent conductive material may include a material selected from the group including indium tin oxide (ITO), indium zinc oxide (IZO), zinc oxide (ZnO), indium oxide ($In_2O_3$), indium gallium oxide (IGO), aluminum zinc oxide (AZO), and combinations thereof.

The organic light-emitting display device may further include a third pixel electrode and a second insulating layer. The third pixel electrode is on the second pixel electrode and includes a metal. The second insulating layer is on the first insulating layer, covers the third pixel electrode and the gate electrode, and includes first, second, and third openings. The first opening is for exposing a portion of the second pixel electrode. The second opening is for exposing a portion of the third pixel electrode. The third opening is for exposing the second upper electrode. The source and drain electrodes may be formed on the second insulating layer. One of the source and drain electrodes may contact the third pixel electrode via the second opening.

The third pixel electrode and the third gate electrode may each include a second metal. The second metal may include a metal selected from the group including aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and combinations thereof.

The third pixel electrode and the third gate electrode may each include multi-layered metal layers.

The first pixel electrode may be a semi-transmissive mirror for partially transmitting and partially reflecting light emitted from the organic emission layer.

The counter electrode may be for reflecting light emitted from the organic emission layer.

The etched surfaces on both sides of each of the first pixel electrode and the second pixel electrode may be identical to each other.

The organic light-emitting display device may further include a third insulating layer on the second insulating layer. The third insulating layer includes a fourth opening exposing a portion of the second pixel electrode exposed via the first opening, and covers the source and drain electrodes and the second upper electrode exposed via the third opening.

According to another exemplary embodiment of the present invention, a method of manufacturing an organic light-emitting display device is disclosed. The method includes performing first, second, third, fourth, and fifth mask processes. The first mask process is for forming a semiconductor layer on a substrate and patterning the semiconductor layer as an active layer of a thin film transistor and a lower electrode of a capacitor. The second mask process is for forming a first insulating layer on the substrate to cover the active layer and the lower electrode, sequentially stacking a first metal layer, a first transparent conductive layer, and a second metal layer on the first insulating layer, and then patterning the first metal layer, the first transparent conductive layer, and the second metal layer as a pixel electrode, a gate electrode of a thin film transistor, and an upper electrode of the capacitor. The pixel electrode includes first, second, and third pixel electrodes that are sequentially stacked. The gate electrode includes first, second, and third gate electrodes that are sequentially stacked. The upper electrode includes first, second, and third upper electrodes that are sequentially stacked. The third mask process is for forming a second insulating layer on the first insulating layer to cover the pixel electrode, the gate electrode, and the upper electrode, and patterning the second insulating layer to have first, second, and third openings, and contact holes. The first and second openings expose the third pixel electrode. The contact holes respectively expose source and drain regions of the active layer. The third opening exposes the third upper electrode. The fourth mask process is for forming a third metal layer on the second insulating layer to cover exposed portions via the first, second, and third openings and the contact holes, and patterning the third metal layer as source and drain electrodes. The fifth mask process is for forming a third insulating layer on the second insulating layer to cover the source and drain electrodes, and patterning the third insulating layer to have a fourth opening exposing the pixel electrode.

After the performing of the second mask process, the method may further include doping the source and drain regions with ion impurities by using the first, second, and third gate electrodes as masks.

The performing of the fourth mask process may include removing a portion of the third pixel electrode exposed via the first opening and the third upper electrode exposed via the third opening.

The performing of the fourth mask process may include removing the third upper electrode exposed via the third opening. After the performing of the fourth mask process, the method may further include doping ion impurities into the lower electrode from the second upper electrode exposed via the third opening.

The first metal layer may include an aluminum alloy.

The aluminum alloy may further include nickel.

The first metal layer may have a thickness in a range of 50 to 200 Å.

The first transparent conductive layer may include a material selected from the group including indium tin oxide (ITO), indium zinc oxide (IZO), zinc oxide (ZnO), indium oxide ($In_2O_3$), indium gallium oxide (IGO), aluminum zinc oxide (AZO), and combinations thereof.

The second metal layer may include a metal selected from the group including aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and combinations thereof.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
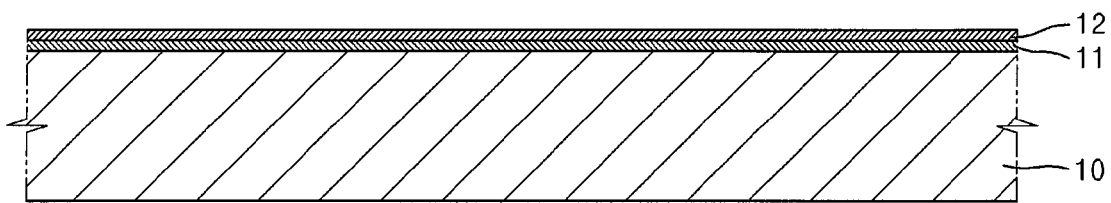
FIGS. 1 through 15 are schematic cross-sectional views sequentially illustrating a method of manufacturing an organic light-emitting display device, according to an embodiment of the present invention.

Hereinafter, exemplary embodiments of the present invention will be described in detail with reference to the accompanying drawings. Like reference numerals refer to like elements throughout.

Figure 15:
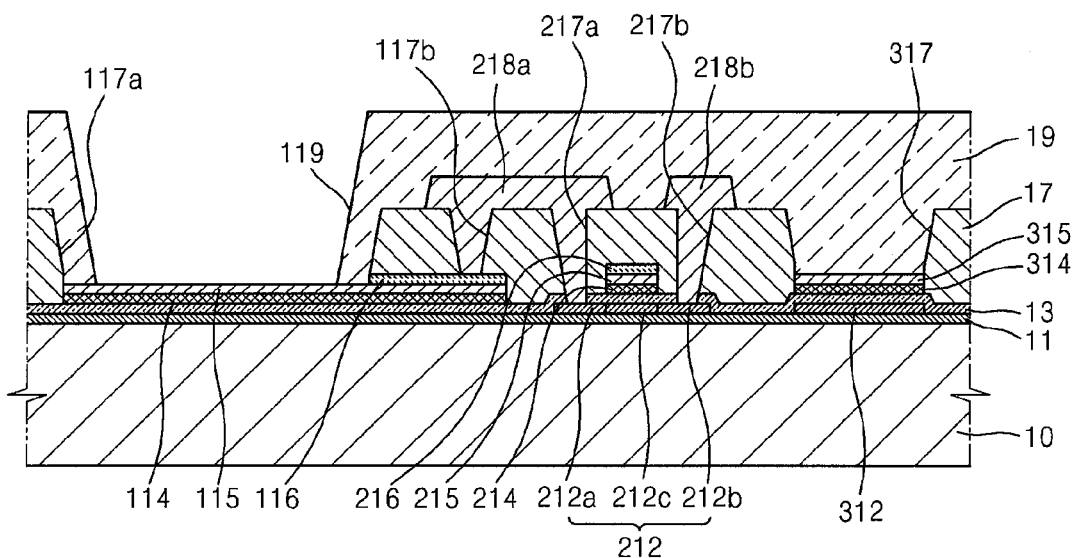
Figure 16:
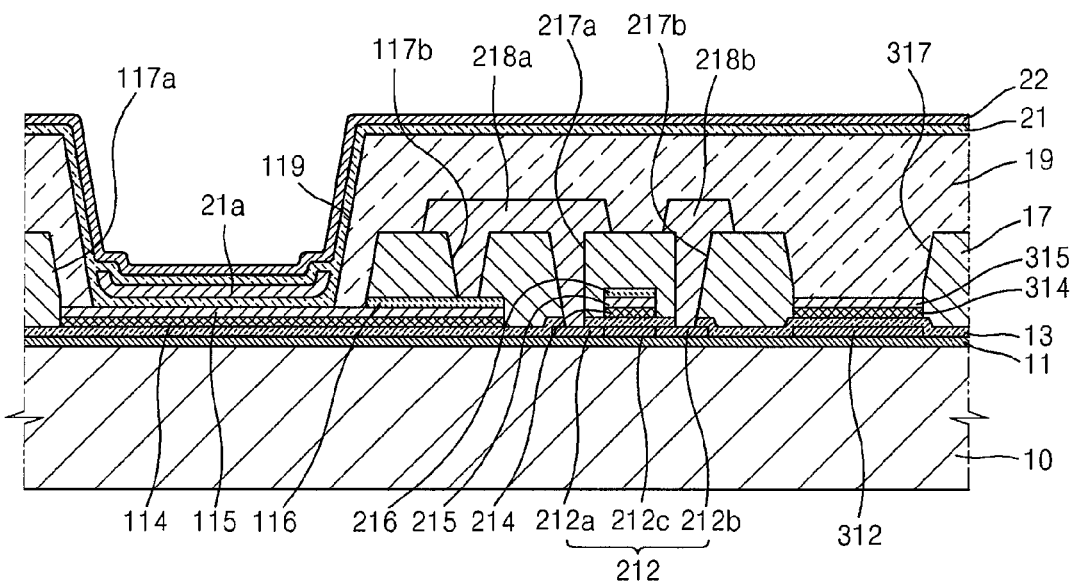
FIG. 16 is a schematic cross-sectional view of an organic light-emitting display device manufactured using the method of FIGS. 1 through 15, according to an embodiment of the present invention.

An organic light-emitting display device according to an embodiment of the present invention and a method of manufacturing the same will be described with reference to FIGS. 1 through 16. FIGS. 1 through 15 are schematic cross-sectional views sequentially illustrating a method of manufacturing an organic light-emitting display device, according to an embodiment of the present invention. FIG. 16 is a schematic cross-sectional view of an organic light-emitting display device manufactured using the method of FIGS. 1 through 15, according to an embodiment of the present invention.

Referring to FIG. 1, a buffer layer 11 and a semiconductor layer 12 are sequentially formed on a substrate 10. The substrate 10 may be formed of a transparent glass material including $SiO_2$ as a main component.

The buffer layer 11 may be formed on the substrate 10 to provide the substrate 10 with a smooth surface and prevent impurity elements from penetrating into the substrate 10. The buffer layer 11 may include $SiO_2$ and/or $SiN_x$ ($x \geq 1$). The buffer layer 11 and the semiconductor layer 12 each may be deposited using any one of various deposition methods such as plasma enhanced chemical vapor deposition (PECVD), atmospheric pressure CVD (APCVD), low pressure CVD (LPCVD), and the like.

The semiconductor layer 12 may be formed on the buffer layer 11. The semiconductor layer 12 may be formed of amorphous silicon or polysilicon. In this regard, the polysilicon may be formed by crystallizing amorphous silicon by rapid thermal annealing (RTA), solid phase crystallization (SPC), excimer laser annealing (ELA), metal induced crystallization (MIC), metal induced lateral crystallization (MILC), sequential lateral solidification (SLS), or the like.

Figure 2:
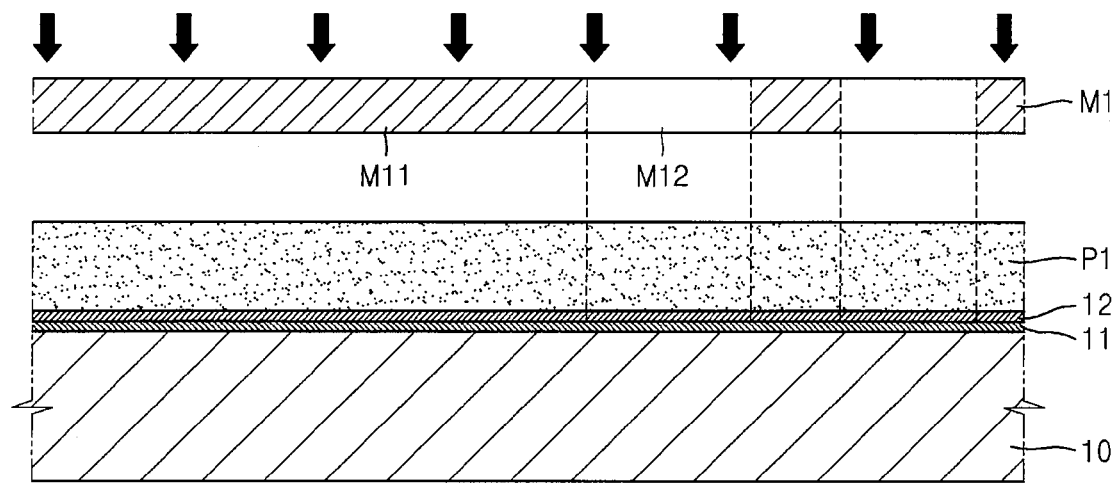

Referring to FIG. 2, a first photo-resist (P1) is coated on the semiconductor layer 12, and a first photomask process is performed thereon using a first photomask M1 including a light-blocking portion M11 and a light-transmitting portion M12. Although not particularly illustrated in FIG. 2, an exposure device is used to perform an exposing process using the first photomask M1, followed by a series of processes such as developing, etching, and stripping or ashing.

Figure 3:
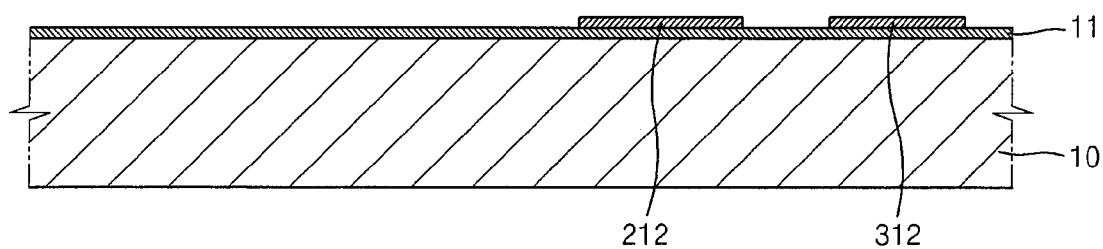

Referring to FIG. 3, because of the first photomask process, the semiconductor layer 12 is patterned as an active layer 212 of a thin film transistor and a lower electrode 312 of a capacitor. The lower electrode 312 of the capacitor is formed of the same material as that of the active layer 212 on the same layer on which the active layer 212 is formed.

Figure 4:
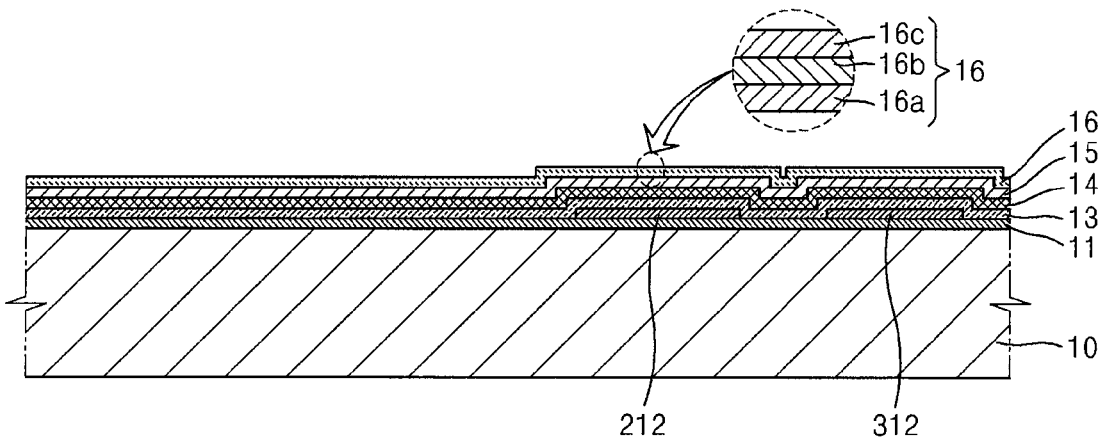

Referring to FIG. 4, a first insulating layer 13, a first metal layer 14, a first transparent conductive layer 15, and a second metal layer 16 are sequentially stacked on the resulting structure of FIG. 3. The first insulating layer 13 may be formed as a single layer formed of $SiO_2$ or $SiN_x$, or a plurality of layers formed of $SiO_2$ and $SiN_x$, and acts as a gate-insulating layer of the thin film transistor and a dielectric layer of the capacitor.

The first metal layer 14 may be formed of an aluminum alloy. The aluminum alloy may include aluminum as a main component and may further include nickel (Ni). In addition, the aluminum alloy may further include a small amount of silicon (Si), lanthanum (La), germanium (Ge), and/or cobalt (Co). Since the first metal layer 14 is formed of an aluminum alloy, when the first metal layer 14, the first transparent conductive layer 15, and the second metal layer 16 are etched, the second metal layer 16 and/or the first transparent conductive layer 15 may be etched without damage. Thus, the manufacturing process of the organic light-emitting display device may be enhanced. In addition, the first metal layer 14 may further include a small amount of Ni, thereby further enhancing etching properties, which results in further enhancing the manufacturing process of the organic light-emitting display device. Because of the etching process, the first metal layer 14, the first transparent conductive layer 15, and the second metal layer 16 have the same (e.g., identical) etched surfaces on their sides (see, for example, FIG. 6).

The first metal layer 14 is formed as a semi-transmissive reflective film, e.g., as a semi-transmissive mirror, and has a thickness of 50 to 200 Å. In one embodiment, when the thickness of the first metal layer 14 is less than 50 Å, the reflectance of the first metal layer 14 decreases significantly and thus, it is difficult to form optical resonance between the first metal layer 14 and a counter electrode, which will be described later. In another embodiment, when the thickness of the first metal layer 14 is greater than 200 Å, the transmissivity of the first metal layer 14 decreases significantly and thus, the luminous efficiency of an organic light-emitting display device decreases.

The first transparent conductive layer 15 may include indium tin oxide (ITO), indium zinc oxide (IZO), zinc oxide (ZnO), indium oxide ($In_2O_3$), indium gallium oxide (IGO), and/or aluminum zinc oxide (AZO). The second metal layer 16 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu).

In the present embodiment, the second metal layer 16 includes Al. In addition, the second metal layer 16 may include a plurality of metal layers, for example, fourth, fifth, and sixth metal layers 16a, 16b, and 16c. In the present embodiment, the second metal layer 16 may have a three-layer structure (Mo/Al/Mo) in which the sixth metal layer 16c is formed on a top surface of the fifth metal layer 16b and the fourth metal layer 16a is formed on a bottom surface of the fifth metal layer 16b, wherein the fifth metal layer 16b is formed of Al or Al alloy and the fourth and sixth metal layers 16a and 16c are each formed of Mo or Mo alloy. However, the second metal layer 16 is not limited to the example described above, and may be formed of various suitable materials and to have various suitable layers.

As described above, since the first metal layer 14 is formed of an aluminum alloy, the stacked structure of the first metal layer 14, the first transparent conductive layer 15, and the second metal layer 16 may be simply patterned. As a result, etched surfaces on all sides of each of the first metal layer 14, the first transparent conductive layer 15, and the second metal layer 16 are the same as one another.

The stacked structure of the first metal layer 14, the first transparent conductive layer 15, and the second metal layer 16 may be patterned by being simultaneously or commonly or concurrently etched using a single etchant. Alternatively, the second metal layer 16 may be first wet etched, the first transparent conductive layer 15 may be wet etched or dry etched, and the second metal layer 16 may be then dry etched.

As described above, the first metal layer 14 formed as a semi-transmissive reflective layer may be simply patterned. Thus, the manufacturing process of the organic light-emitting display device may be enhanced.

Figure 5:
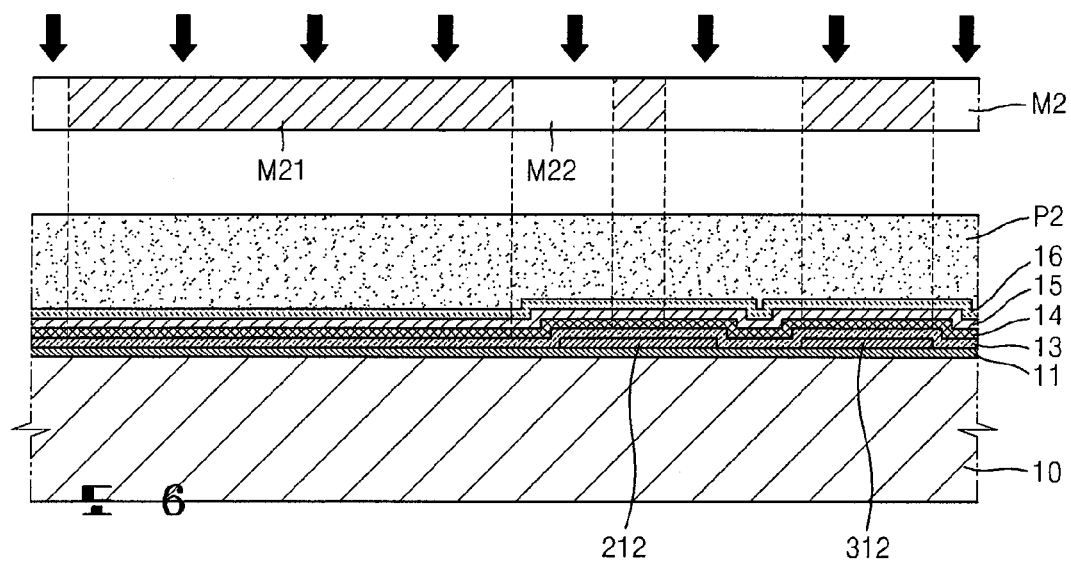
Figure 6:
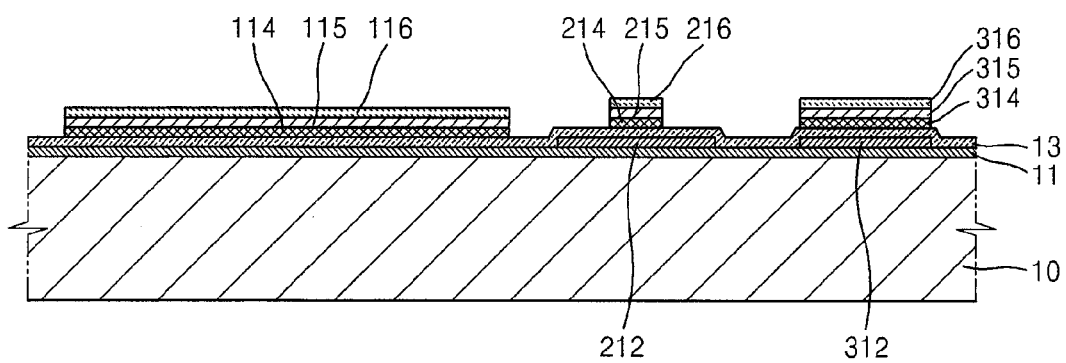

Referring to FIG. 5, a second photo-resist P2 is coated on the second metal layer 16, and a second mask process is performed using a second photomask M2 including a light-blocking portion M21 and a light-transmitting portion M22. Referring to FIG. 6, as a result of the second mask process, the first metal layer 14, the first transparent conductive layer 15, and the second metal layer 16 are patterned as first, second, and third pixel electrodes 114, 115, and 116, respectively, first, second, and third gate electrodes 214, 215, and 216, respectively, of the thin film transistor, and first, second, and third upper electrodes 314, 315, and 316, respectively, of the capacitor.

Figure 7:
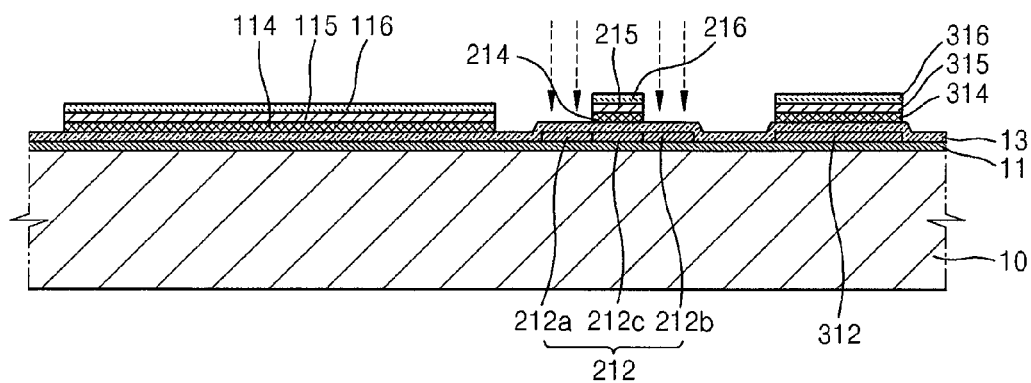

Referring to FIG. 7, the active layer 212 is doped with ion impurities by using the first, second, and third gate electrodes 214, 215, and 216 formed as a result of the second mask process as self-aligned masks. As a result, the active layer 212 includes source and drain regions 212a and 212b that are doped with the ion impurities and a channel region 212c disposed therebetween. That is, by using the first, second, and third gate electrodes 214, 215, and 216 as self-aligned masks, the source and drain regions 212a and 212b may be formed without using a separate photomask.

Figure 8:
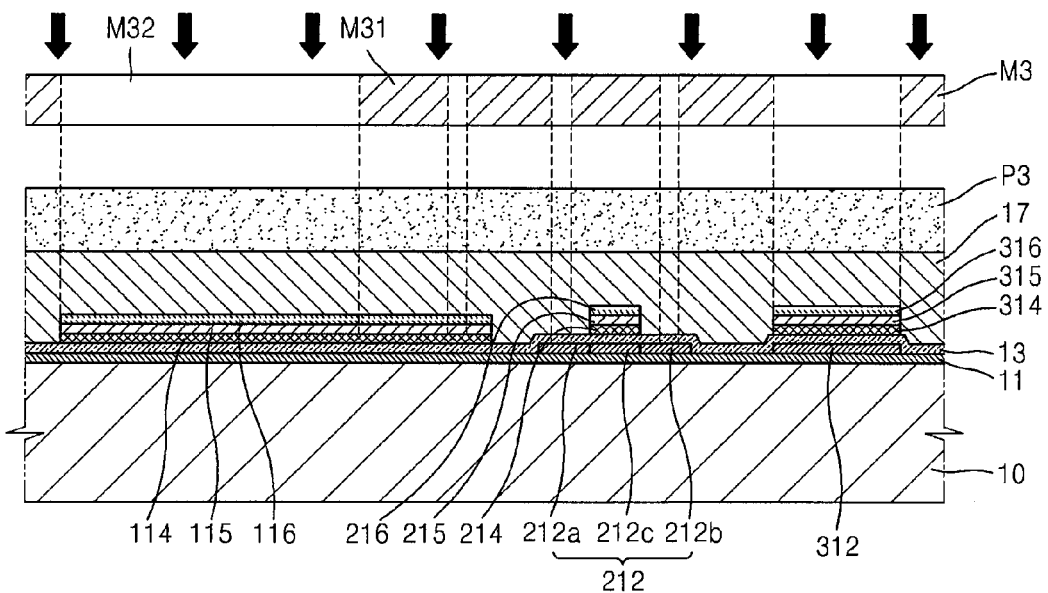
Figure 9:
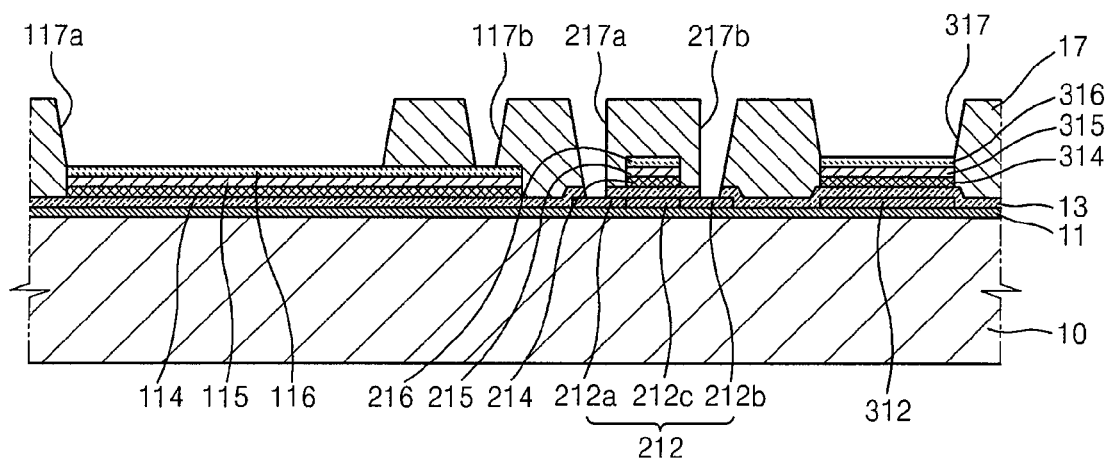

Referring to FIG. 8, a second insulating layer 17 and a third photo-resist P3 are coated on the structure obtained as a result of the second mask process, and a third mask process is performed using a third photomask M3 including a light-blocking portion M31 and a light-transmitting portion M32. Referring to FIG. 9, as a result of the third mask process, a first opening 117a and a second opening 117b for exposing portions of the third pixel electrode 116, contact holes 217a and 217b that respectively expose the source and drain regions 212a and 212b of the thin film transistor, and a third opening 317 for exposing portions of the third upper electrode 316 of the capacitor are formed in the second insulating layer 17.

Figure 10:
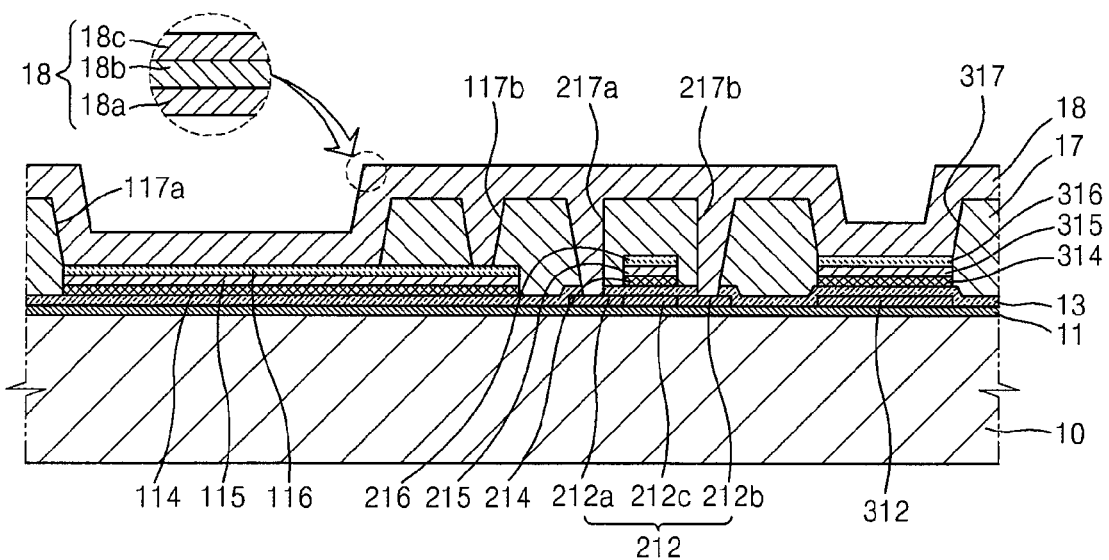

Referring to FIG. 10, a third metal layer 18 is formed on the resulting structure of FIG. 9. The third metal layer 18 may include Al, Pt, Pd, Ag, Mg, Au, Ni, Nd, Ir, chromium (Cr), Li, Ca, Mo, Ti, W, and/or Cu. In the present embodiment, the third metal layer 18 includes Al.

In addition, the third metal layer 18 may include a plurality of metal layers, for example, seventh, eighth, and ninth metal layers 18a, 18b, and 18c. In the present embodiment, like the second metal layer 16, the third metal layer 18 may have a three-layer structure (Mo/Al/Mo) in which the ninth metal layer 18c is formed on a top surface of the eighth metal layer 18b and the seventh metal layer 18a is formed on a bottom surface of the eighth metal layer 18b, wherein the eighth metal layer 18b is formed of Al or Al alloy and the seventh and ninth metal layers 18a and 18c are each formed of Mo or Mo alloy. However, the third metal layer 18 is not limited to the example described above, and may be formed of various suitable materials and formed to have various suitable layers. For example, the third metal layer 18 may have a three-layer structure including a Ti layer, an Al layer, and a Ti layer.

Figure 11:
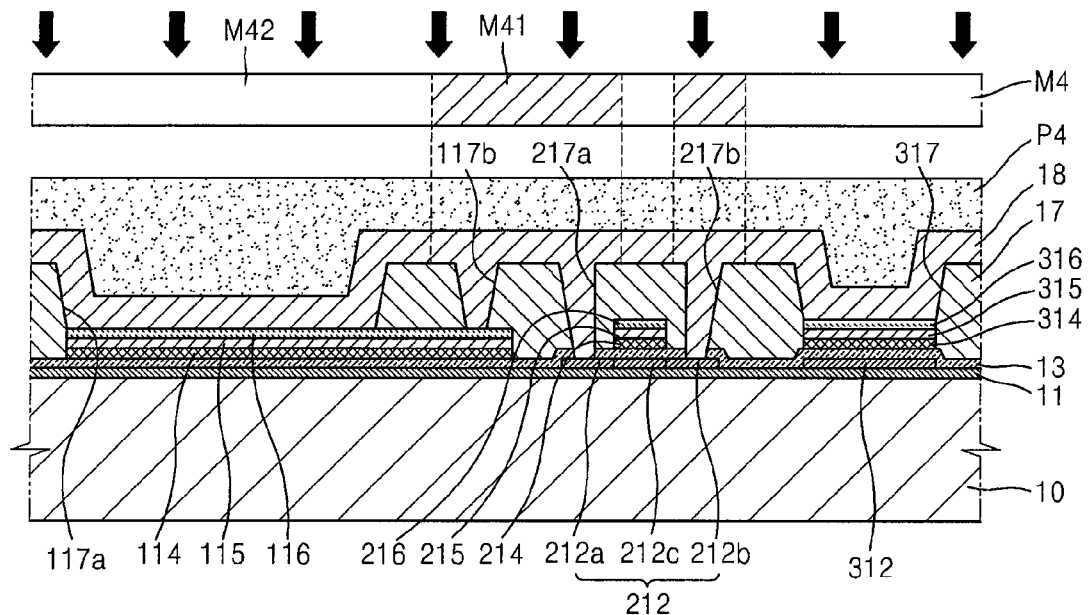

Referring to FIG. 11, a fourth photo-resist P4 is coated on the third metal layer 18, and a fourth mask process is performed using a fourth photomask M4 including a light-blocking portion M41 and a light-transmitting portion M42. The third metal layer 18 is patterned in the fourth mask process. In this regard, when the third metal layer 18 is etched, portions of the second metal layer 16 formed below the third metal layer 18 may also be patterned.

Figure 12:
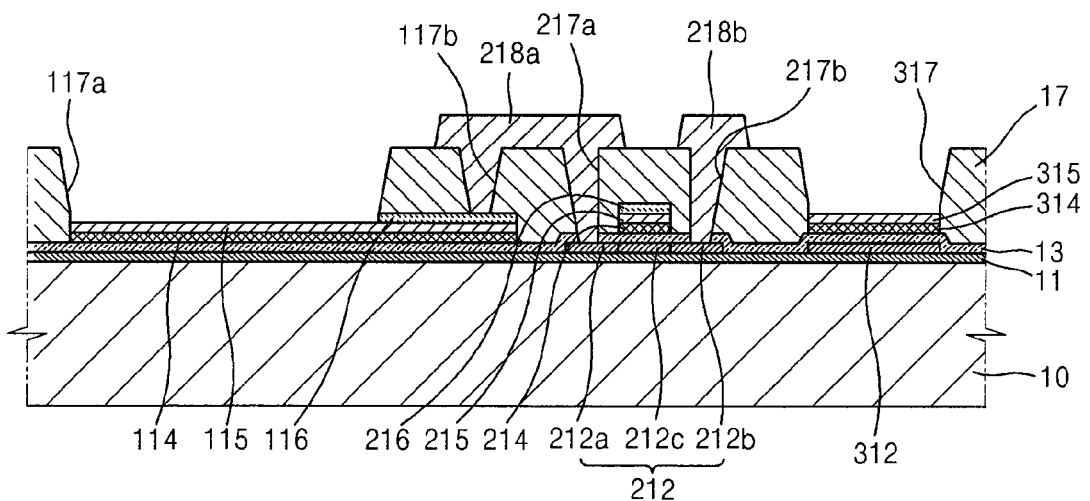

That is, referring to FIG. 12, the third metal layer 18 is patterned to form source and drain electrodes 218a and 218b that are respectively electrically connected to the source and drain regions 212a and 212b. In this patterning process, a portion of the third pixel electrode 116 exposed via the first opening 117a and the third upper electrode 316 exposed via the third opening 317 are simultaneously or commonly or concurrently etched and removed. As a result, the second pixel electrode 115 and the second upper electrode 315 are respectively exposed via the first opening 117a and the third opening 317.

Figure 13:
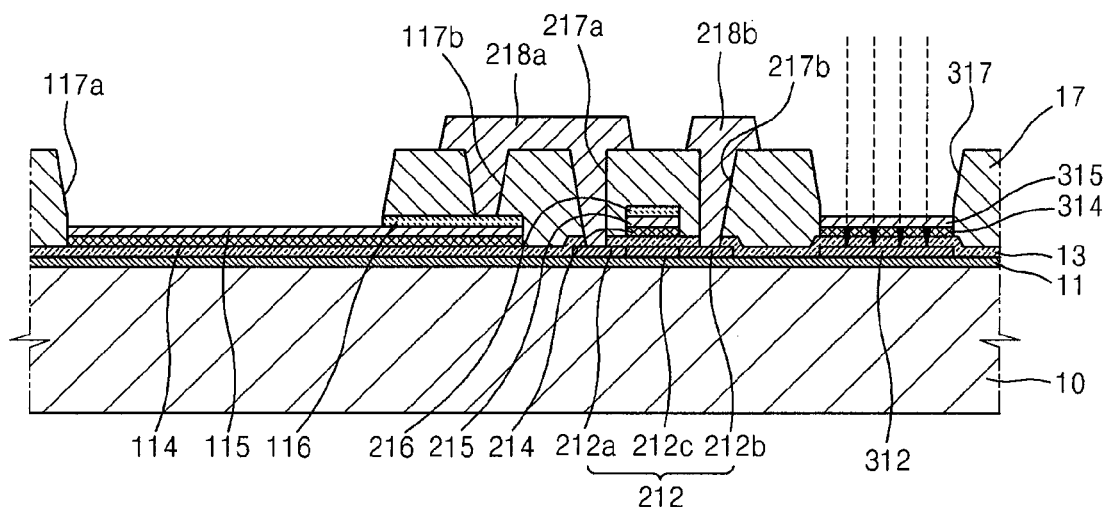

Referring to FIG. 13, the structure obtained as a result of the fourth mask process is doped with ion impurities. The doped ion impurities are B ions and/or P ions, and the doping concentration of the ion impurities is $1\times10^{15}$ atoms/cm$^2$ or greater, and the doping process is performed, targeting the lower electrode 312 of the capacitor, which is formed by patterning the semiconductor layer 12. Accordingly, the lower electrode 312 of the capacitor becomes highly conductive, thereby forming a metal-insulator-metal (MIM) capacitor together with the first upper electrode 314 and the second upper electrode 315, which may result in increasing the capacitance of the capacitor.

Figure 14:
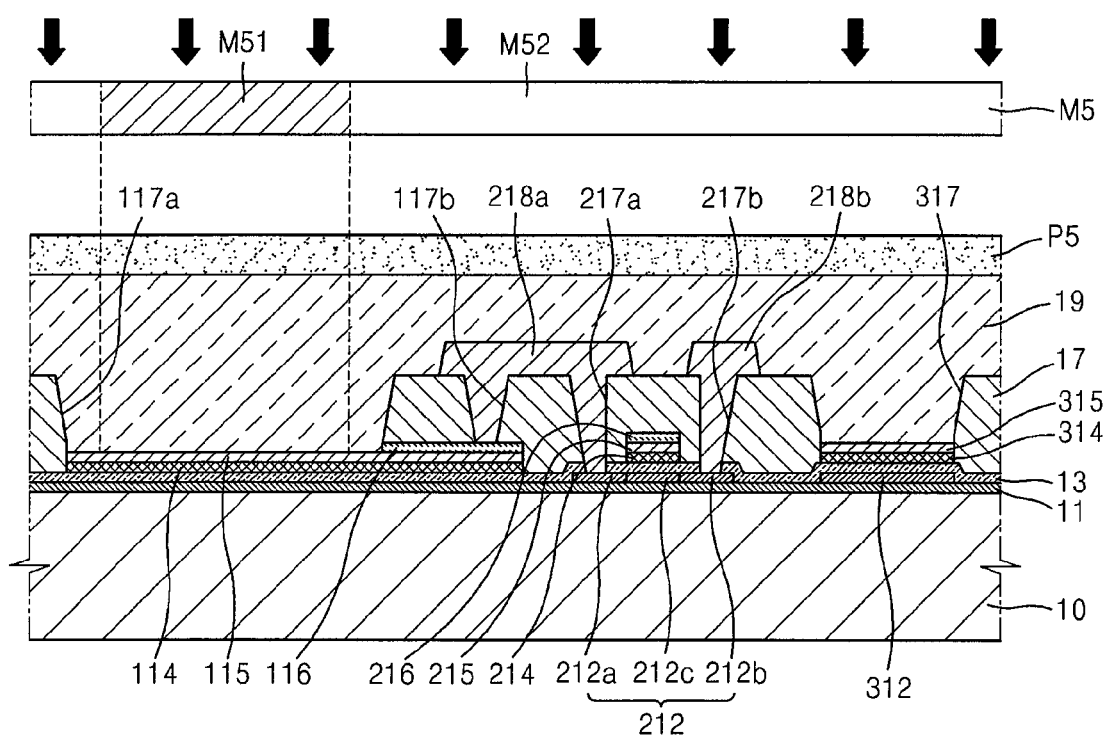

Referring to FIG. 14, a fifth photo-resist P5 is coated on the resulting structure of FIG. 13, and a fifth mask process is performed using a fifth photomask M5 including a light-blocking portion M51 and a light-transmitting portion M52. In this regard, the exposure device is used to perform an exposing process using the fifth photomask M5, followed by developing and ashing processes. As illustrated in FIG. 15, a fourth opening 119 for exposing the second pixel electrode 115 is formed in the fifth photo-resist P5, and the remaining portion of the fifth photo-resist P5 is then sintered and formed as a third insulating layer 19. The fifth mask process is not limited to the example described above, and may be performed by forming the third insulating layer 19 using an organic material and/or an inorganic material, coating the fifth photo-resist P5 on the third insulating layer 19, and performing a general mask process thereon to form the fourth opening 119.

Since the first pixel electrode 114, including a semi-transmissive mirror, is disposed below the second pixel electrode 115 exposed via the fourth opening 119, the first pixel electrode 114 may partially transmit light and partially reflect light. By using the first pixel electrode 114, which is a semi-transmissive mirror capable of partially transmitting and reflecting light, an organic light-emitting display device employing an optical resonance structure may be manufactured. In the present embodiment, since the first pixel electrode 114, which acts as a semi-transmissive mirror, is formed of an aluminum alloy, the first pixel electrode 114 and the second pixel electrode 115 may be simultaneously or commonly or concurrently patterned and thus, the manufacturing process of the organic light-emitting display device may be enhanced.

Referring to FIG. 16, an organic layer 21, including an organic emission layer 21a, and a counter electrode 22 are formed on the second pixel electrode 115. The organic emission layer 21a may be formed of a low molecular weight or high molecular weight organic material.

The organic layer 21 includes a hole transport layer (HTL) and a hole injection layer (HIL) that are sequentially stacked on the organic emission layer 21a towards the second pixel electrode 115, and includes an electron transport layer (ETL) and an electron injection layer (EIL) that are sequentially stacked on the organic emission layer 21a towards the counter electrode 22. The organic layer 21 may further include various other suitable layers, if necessary. The organic layer 21, including the organic emission layer 21a, may realize the optical resonance structure by suitably varying the thicknesses of the organic emission layer 21a for each pixel or the thicknesses of the other layers included in the organic layer 21 except for the organic emission layer 21a.

The counter electrode 22 is formed on the organic layer 21 as a common electrode. In the organic light-emitting display device according to the present embodiment, the first pixel electrode 114 and the second pixel electrode 115 are used as an anode, and the counter electrode 22 is used as a cathode; however, the opposite case is also possible.

In addition, the counter electrode 22 may be formed as a reflective electrode including a reflective material in order to form an optical resonance structure. In this regard, the counter electrode 22 may be formed of Al, Ag, Mg, Li, Ca, LiF/Ca, or LiF/Al. Also, a sealing element and an absorbent element may be further formed on the counter electrode 22 to protect the organic emission layer 21a from external moisture or oxygen.

Embodiments of the present invention may be directed to a bottom-emission type organic light-emitting display device, in which the displayed image is realized towards the substrate 10. By having a distance between the counter electrode 22 and the first pixel electrode 114 be a resonance thickness, such embodiments may also have enhanced luminous efficiency by using the optical resonance.

In addition, the lower electrode 312 of the capacitor is formed using N+- or P+-doped polysilicon, and the first upper electrode 314 and the second upper electrode 315 are respectively formed using a conductive metal and a transparent conductive material, e.g., a metal oxide, thereby forming an MIM capacitor. In contrast, when a metal-oxide-silicon (MOS) capacitor is used, a high voltage needs to be continuously applied to a specific wiring of a panel, and thus there is a large risk of electrical shortage. However, as described above, the organic light-emitting display device includes the MIM capacitor and thus, these problems may be prevented or reduced, and limitations on the design of the organic light-emitting display device are decreased.

The organic light-emitting display device and the method of manufacturing the same as described above provide the following effects. First, a pixel electrode employs a semi-transmissive mirror, thereby forming optical resonance in a bottom-emission type organic light-emitting display device in which the displayed image is realized towards a pixel electrode. Thus, the luminous efficiency of the organic light-emitting display device may be enhanced.

Second, the semi-transmissive mirror is formed of an aluminum alloy, thereby reducing or preventing the damage of a transparent conductive layer or a gate electrode in a patterning process of the pixel electrode. In addition, this allows patterning a plurality of stacked structures of the pixel electrode in a single process. Thus, the manufacturing process of the organic light-emitting display device may be enhanced.

Third, the organic light-emitting display device including the semi-transmissive mirror may be manufactured by five mask processes. Fourth, an MIM capacitor structure may be formed in a simple process and thus, the manufacturing process and circuit characteristics thereof may be enhanced.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. A method of manufacturing an organic light-emitting display device, the method comprising:
   performing a first mask process for forming a semiconductor layer on a substrate and patterning the semiconductor layer as an active layer of a thin film transistor and a lower electrode of a capacitor;
   performing a second mask process for forming a first insulating layer on the substrate to cover the active layer and the lower electrode, sequentially stacking a first metal layer, a first transparent conductive layer, and a second metal layer on the first insulating layer, and then patterning the first metal layer, the first transparent conductive layer, and the second metal layer as a pixel electrode comprising a first pixel electrode, a second pixel electrode, and a third pixel electrode that are sequentially stacked, as a gate electrode of the thin film transistor comprising a first gate electrode, a second gate electrode, and a third gate electrode that are sequentially stacked, and as an upper electrode of the capacitor comprising a first upper electrode, a second upper electrode, and a third upper electrode that are sequentially stacked;

performing a third mask process for forming a second insulating layer on the first insulating layer to cover the pixel electrode, the gate electrode, and the upper electrode, and patterning the second insulating layer to have first and second openings that expose the third pixel electrode, contact holes that respectively expose source and drain regions of the active layer, and a third opening exposing the third upper electrode;

performing a fourth mask process for forming a third metal layer on the second insulating layer to cover exposed portions via the first, second, and third openings and the contact holes, and patterning the third metal layer as source and drain electrodes; and performing a fifth mask process for forming a third insulating layer on the second insulating layer to cover the source and drain electrodes, and patterning the third insulating layer to have a fourth opening exposing the pixel electrode.

2. The method of claim 1, wherein, after the performing of the second mask process, the method further comprising doping the source and drain regions with ion impurities by using the first, second, and third gate electrodes as masks.

3. The method of claim 1, wherein the performing of the fourth mask process comprises removing a portion of the third pixel electrode exposed via the first opening and the third upper electrode exposed via the third opening.

4. The method of claim 2,
wherein the performing of the fourth mask process comprises removing the third upper electrode exposed via the third opening, and
wherein, after the performing of the fourth mask process, the method further comprising doping ion impurities into the lower electrode from the second upper electrode exposed via the third opening.

5. The method of claim 1, wherein the first metal layer comprises an aluminum alloy.

6. The method of claim 5, wherein the aluminum alloy further comprises nickel.

7. The method of claim 5, wherein the first metal layer has a thickness in a range of 50 to 200 Å.

8. The method of claim 1, wherein the first transparent conductive layer comprises a material selected from the group consisting of indium tin oxide (ITO), indium zinc oxide (IZO), zinc oxide (ZnO), indium oxide ($In_2O_3$), indium gallium oxide (IGO), aluminum zinc oxide (AZO), and combinations thereof.

9. The method of claim 1, wherein the second metal layer comprises a metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and combinations thereof.

* * * * *